United States Patent
Makiyama et al.

(10) Patent No.: US 8,709,886 B2
(45) Date of Patent: Apr. 29, 2014

(54) COMPOUND SEMICONDUCTOR DEVICE AND MANUFACTURING METHOD THEREFOR

(75) Inventors: Kozo Makiyama, Kawasaki (JP); Naoya Okamoto, Isehara (JP); Toshihiro Ohki, Hadano (JP); Yuichi Minoura, Zama (JP); Shirou Ozaki, Yamato (JP); Toyoo Miyajima, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/555,420

(22) Filed: Jul. 23, 2012

(65) Prior Publication Data
US 2013/0083568 A1   Apr. 4, 2013

(30) Foreign Application Priority Data
Sep. 29, 2011   (JP) .................................. 2011-215198

(51) Int. Cl.
*H01L 21/338*   (2006.01)
(52) U.S. Cl.
USPC ........... 438/172; 438/589; 438/757; 438/167; 257/192; 257/194; 257/E29.246

(58) Field of Classification Search
USPC .......... 438/589, 757, 167, 172; 257/192, 194, 257/E29.246
See application file for complete search history.

(56) References Cited

U.S. PATENT DOCUMENTS

| | | | |
|---|---|---|---|
| 7,592,211 B2 | 9/2009 | Sheppard | |
| 7,709,269 B2 | 5/2010 | Smith | |
| 7,960,756 B2 | 6/2011 | Sheppard | |
| 8,049,252 B2 | 11/2011 | Smith | |
| 2005/0139838 A1* | 6/2005 | Murata et al. | 257/73 |
| 2008/0157121 A1* | 7/2008 | Ohki | 257/194 |
| 2008/0203541 A1* | 8/2008 | Makiyama | 257/640 |

FOREIGN PATENT DOCUMENTS

JP   2009-524242 A1   6/2009

* cited by examiner

*Primary Examiner* — Kimberly Rizkallah
*Assistant Examiner* — Maria Ligai
(74) *Attorney, Agent, or Firm* — Kratz, Quintos & Hanson, LLP (57) ABSTRACT

An HEMT includes, on an SiC substrate, a compound semiconductor layer, a silicon nitride (SiN) protective film having an opening and covering the compound semiconductor layer, and a gate electrode formed on the compound semiconductor layer so as to plug the opening. In the protective film, a projecting portion projecting from a side surface of the opening is formed at a lower layer portion 6a.

6 Claims, 10 Drawing Sheets

CONVENTIONAL STRUCTURE

FIG. 6B

STRUCTURE ACCORDING TO
FIRST EMBODIMENT

CONVENTIONAL STRUCTURE

FIG. 10B

STRUCTURE ACCORDING TO
SECOND EMBODIMENT

COMPOUND SEMICONDUCTOR DEVICE AND MANUFACTURING METHOD THEREFOR

CROSS-REFERENCE TO RELATED APPLICATION

This application is based upon and claims the benefit of priority of the prior Japanese Patent Application No. 2011-215198, filed on Sep. 29, 2011, the entire contents of which are incorporated herein by reference.

FIELD

Embodiments relate to a compound semiconductor device and a manufacturing method for the compound semiconductor device.

BACKGROUND

Development of a nitride semiconductor device as a high-voltage, high-power semiconductor device by taking advantage of features such as a high saturated electron velocity and a wide band gap is active and ongoing. Nitride semiconductor devices include field-effect transistors. There have been numerous reports on field-effect transistors, particularly high electron mobility transistors (HEMTs). Among HEMTs, an AlGaN/GaN HEMT using GaN in an electron transit layer and AlGaN in an electron supply layer is attracting attention. In an AlGaN/GaN HEMT, distortion occurs in AlGaN due to the difference in lattice constants between GaN and AlGaN. Piezoelectric polarization resulting from the distortion and spontaneous polarization of AlGaN lead to formation of a high concentration of two-dimensional electron gas (2DEG). Accordingly, high voltage and high power can be achieved.

Patent Literature 1: Japanese National Publication of International Patent Application No. 2009-524242

Operating voltage needs to be increased in a nitride semiconductor device for high output and high frequency applications, such as an AlGaN/GaN HEMT, to obtain high power. An increase in operating voltage, however, increases the electric field strength at and around a gate electrode and causes deterioration in device characteristics (chemical and physical changes). In order to enhance the reliability of a high-power nitride semiconductor device, it is essential to inhibit deterioration in device characteristics caused by a high electric field at and around a gate electrode.

SUMMARY

An embodiment of a compound semiconductor device includes a compound semiconductor layer, a silicon nitride protective film having an opening and covering the compound semiconductor layer, and an electrode formed on the compound semiconductor layer so as to plug the opening. A lower layer portion of the protective film includes a portion (a projecting portion) projecting from a side surface of the opening.

An embodiment of a method for manufacturing a compound semiconductor device includes forming a silicon nitride protective film on a compound semiconductor layer, forming an opening in the protective film, and forming an electrode on the compound semiconductor layer so as to plug the opening. The forming the opening includes forming the opening such that a lower layer portion of the protective film includes a projecting portion projecting from a side surface of the opening.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described below in detail with reference to the drawings. Configurations of a compound semiconductor device will be described together with methods for manufacturing the compound semiconductor device in the embodiments below.

Note that, in the drawings, some components may not be illustrated with correct relative sizes and thicknesses for illustrative convenience.

First Embodiment

The present embodiment discloses a Schottky AlGaN/GaN HEMT as a compound semiconductor device.

FIGS. 1A to 3B are schematic sectional views illustrating, in the order of steps, a method for manufacturing a Schottky AlGaN/GaN HEMT according to the first embodiment.

Figure 1A:
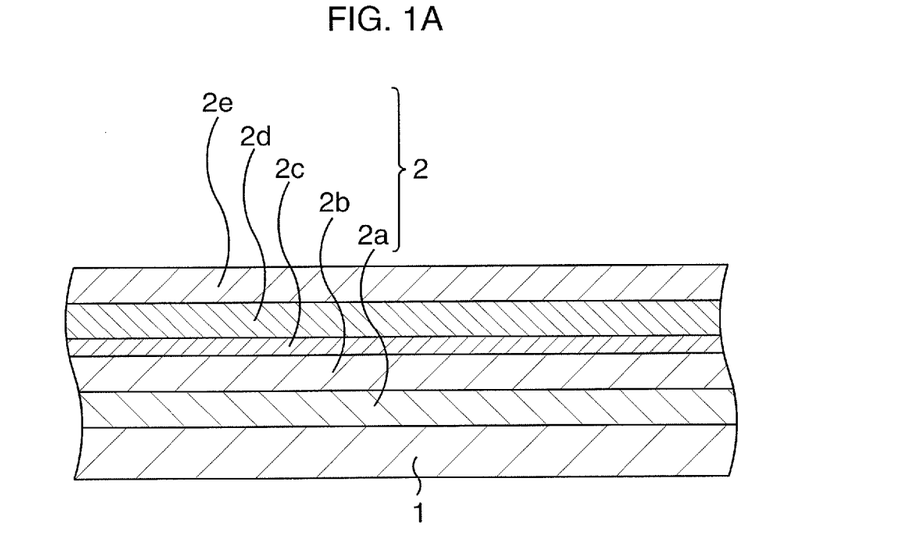
FIGS. 1A to 1C are schematic sectional views illustrating, in the order of steps, a method for manufacturing a Schottky AlGaN/GaN HEMT according to a first embodiment.

As illustrated in FIG. 1A, a compound semiconductor layer 2 which is a compound semiconductor laminated structure is first formed on, for example, a semi-insulating SiC substrate 1 as a growth substrate. The compound semiconductor layer 2 includes a buffer layer 2a, an electron transit layer 2b, an intermediate layer 2c, an electron supply layer 2d, and a cap layer 2e. In an AlGaN/GaN HEMT, two-dimensional electron gas (2DEG) is generated near an interface between the electron transit layer 2b and the electron supply layer 2d (the intermediate layer 2c to be exact).

More specifically, the compound semiconductors below are grown on the SiC substrate 1 by, e.g., metal organic vapor phase epitaxy (MOVPE). Molecular beam epitaxy (MBE) or the like may be used instead of MOVPE.

AlN, i-GaN (intentionally undoped GaN), i-AlGaN, n-AlGaN, and n-GaN are deposited in order on the SiC substrate 1. With this process, the buffer layer 2a, electron transit layer 2b, intermediate layer 2c, electron supply layer 2d, and cap layer 2e are stacked and formed. The growth conditions for AlN, GaN, and AlGaN are that a gaseous mixture of trimethyl aluminum gas, trimethyl gallium gas, and ammonia gas is used as a source gas, that whether to supply trimethyl aluminum gas as an Al source and trimethyl gallium gas as a Ga source and the flow rates of the gases are appropriately set according to a compound semiconductor layer to be grown, that the flow rates of ammonia gas as a common material are about 100 sccm to 10 slm, that the growth pressures for AlN, GaN, and AlGaN are about 50 to 300 Torr, and that the growth temperatures are about 1000 to 1200° C.

When GaN (or AlGaN) is to be grown as n-type, for example, $SiH_4$ gas containing an n-type impurity such as Si is added to a source gas at a predetermined flow rate, and GaN (or AlGaN) is doped with Si. The doping concentrations of Si are set to about $1\times10^{18}/cm^3$ to $1\times10^{20}/cm^3$ (e.g., $5\times10^{18}/cm^3$).

The buffer layer 2a is formed to a thickness of about 0.1 μm, the electron transit layer 2b is formed to a thickness of about 3 μm, the intermediate layer 2c is formed to a thickness of about 5 nm, the electron supply layer 2d is formed to a thickness of about 20 nm with an Al ratio of, e.g., about 0.2 to 0.3, and the cap layer 2e is formed to a thickness of about 10 nm.

Figure 1B:
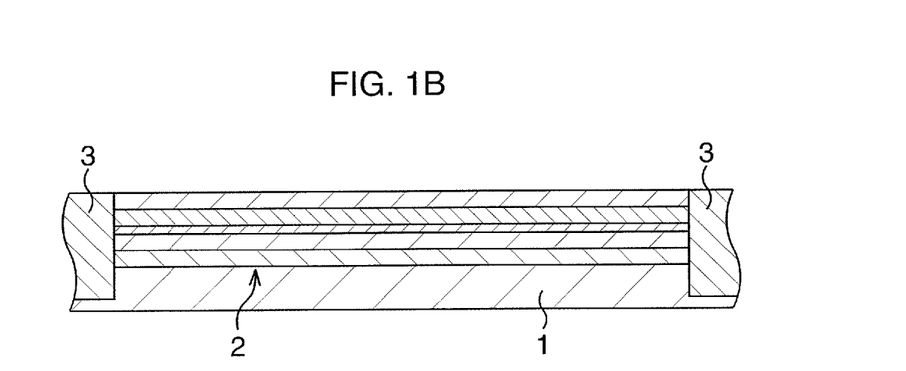

As illustrated in FIG. 1B, a device isolation structure 3 is formed.

More specifically, for example, argon (Ar) is injected into a device isolation region of the compound semiconductor layer 2. With this process, the device isolation structure 3 is formed at superficial portions of the compound semiconductor layer 2 and SiC substrate 1. The device isolation structure 3 defines an active region on the compound semiconductor layer 2.

Note that the device isolation may be performed by, e.g., shallow trench isolation (STI) instead of the injection.

Figure 1C:
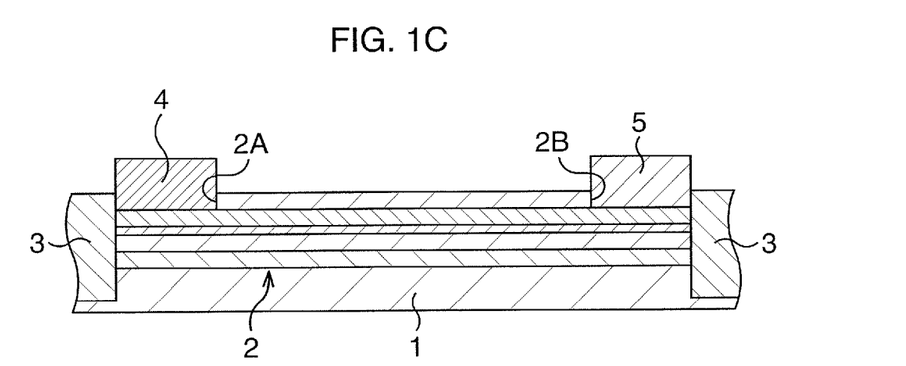

As illustrated in FIG. 1C, a source electrode 4 and a drain electrode 5 are formed.

More specifically, electrode grooves 2A and 2B are first formed in the cap layer 2e, at positions where a source electrode and a drain electrode are to be formed at a surface of the compound semiconductor layer 2.

A resist mask having openings corresponding to the positions where the source electrode and drain electrode are to be formed at the surface of the compound semiconductor layer 2 is formed. The cap layer 2e is partially removed by dry etching using the resist mask. With these processes, the electrode grooves 2A and 2B are formed. An inert gas such as Ar and a chlorinated gas such as $Cl_2$ are used as etching gases in the dry etching. The electrode grooves may be formed by dry-etching the compound semiconductor layer 2 so as to penetrate the cap layer 2e and reach a superficial portion of the electron supply layer 2d.

Ti and Al are used as examples of an electrode material. For example, a double-layer resist with an overhang structure suitable for evaporation or lift-off is used to form the electrodes. The resist is applied to the compound semiconductor layer 2 to form the resist mask that is open so as to expose the electrode grooves 2A and 2B. Ti and Al are deposited while using the resist mask. The thickness of Ti is set to about 20 nm, and the thickness of Al is set to about 200 nm. The resist mask with the overhang structure and Ti and Al deposited on the resist mask are removed by lift-off. After that, the SiC substrate 1 is heat-treated at a temperature of about 550° C. in, for example, a nitrogen atmosphere. Remaining Ti and Al are made to form an ohmic contact with the electron supply layer 2d. With the above-described processes, the source electrode 4 and drain electrode 5, which plug the electrode grooves 2A and 2B with lower portions of Ti and Al, are formed.

Figure 2A:
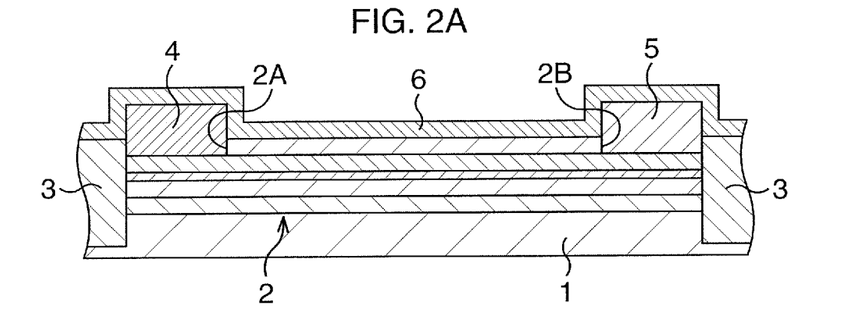
FIGS. 2A to 2C are schematic sectional views illustrating, in the order of steps, the method for manufacturing the Schottky AlGaN/GaN HEMT according to the first embodiment, following FIGS. 1A to 1C.

As illustrated in FIG. 2A, a passivation film 6 for protecting the surface of the compound semiconductor layer 2 is formed.

More specifically, silicon nitride (a silicon nitride) is deposited across the surface of the compound semiconductor layer 2 to a thickness of, e.g., about 50 nm by plasma CVD or the like to form the passivation film 6. A silicon nitride is a stable insulator and is suitably used for a protective film of the surface of the compound semiconductor layer 2.

Figure 4:
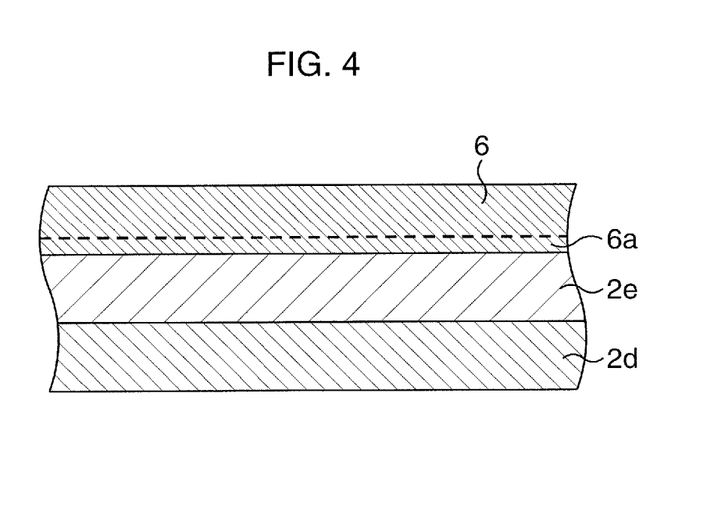
FIG. 4 is a schematic sectional view illustrating, on an enlarged scale, a part of a passivation film formed in the step in FIG. 2A.

FIG. 4 illustrates, on an enlarged scale, a part of the passivation film 6.

In the passivation film 6, the percentage of nitrogen (N) vacancies of a lower layer portion 6a in contact with the surface of the compound semiconductor layer 2 is higher than that of silicon nitride in stoichiometric condition ($Si_3N_4$). The passivation film 6 is formed so as to drastically and continuously approach stoichiometric condition toward the top. Note that although a boundary between the lower layer portion 6a and the other portion is illustrated by a broken line for the sake of convenience, there is no clear boundary. If silicon nitride has "a high percentage of N vacancies," this means in the present embodiment that the silicon nitride has a high composition ratio of Si. The percentage of N vacancies of the lower layer portion 6a to N atoms of silicon nitride in stoichiometric condition is not more than 50% (X in $Si_3N_x$ is not more than 2). If a portion extending downward from a point where the percentage of N vacancies is 50% in a thickness direction of the passivation film 6 is defined as the lower layer portion 6a, the thickness of the lower layer portion 6a is about 2 to 5 nm. If the thickness of the lower layer portion 6a is less than 2 nm, the lower layer portion cannot provide sufficient efficacy (to be described later). If the thickness of the lower layer portion 6a is more than nm, a gate leak current is larger. Since the thickness of the lower layer portion 6a is set to about 2 to 5 nm, the lower layer portion can provide sufficient efficacy (to be described later) without increasing a gate leak current. In the present embodiment, the lower layer portion 6a is formed so as to have the percentage of N vacancies to N atoms of silicon nitride in stoichiometric condition set to, e.g., about 50% and a thickness of, e.g., about 3 nm.

To form the passivation film 6, for example, $SiH_4$ gas and $N_2$ gas are supplied at a flow rate of 5 sccm and at a flow rate of 100 sccm, respectively, into a film forming chamber for plasma CVD before electric discharge. RF waves (13.56 MHz, 50 W) are applied through a shower head, e.g., 30 sec after the start of the introduction of $SiH_4$ gas and $N_2$ gas. $N_2$ gas starts to be supplied at a flow rate of 200 sccm within 2 sec of the start of the introduction of SiH$_4$ gas (the flow rate of 200 sccm includes the earlier flow rate of 100 sccm).

Figure 2B:
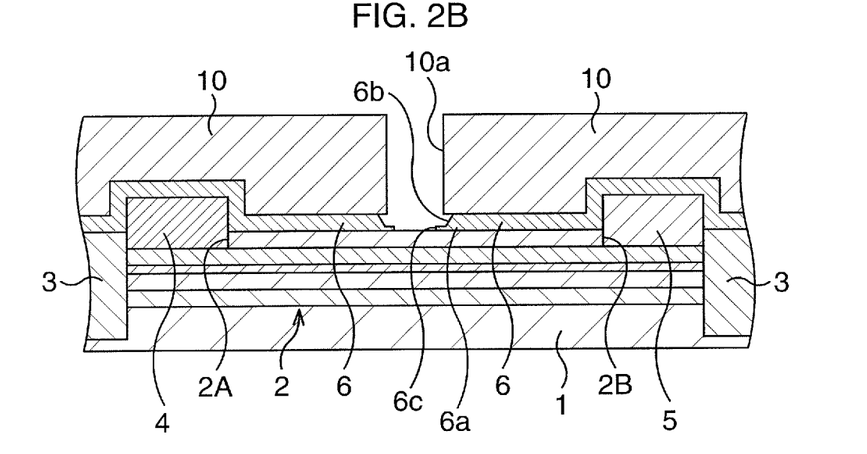

As illustrated in FIG. 2B, an opening 6b is formed in the passivation film 6.

More specifically, a resist is first applied to the entire surface of the passivation film 6. The resist is subjected to exposure for an opening having a width of, e.g., 600 nm by the UV method and is developed. With these processes, a resist mask 10 having an opening 10a is formed.

The passivation film 6 is wet-etched by using the resist mask 10. The wet etching is performed under the condition that the etching rate at the lower layer portion 6a of the passivation film 6 is lower than that at the other portion. A buffer solution which is a mixture of hydrofluoric acid and ammonium fluoride is used as an etchant. With the wet etching, a portion exposed in the opening 10a of the passivation film 6 is etched, and the opening 6b is formed in the passivation film 6.

Figure 5:
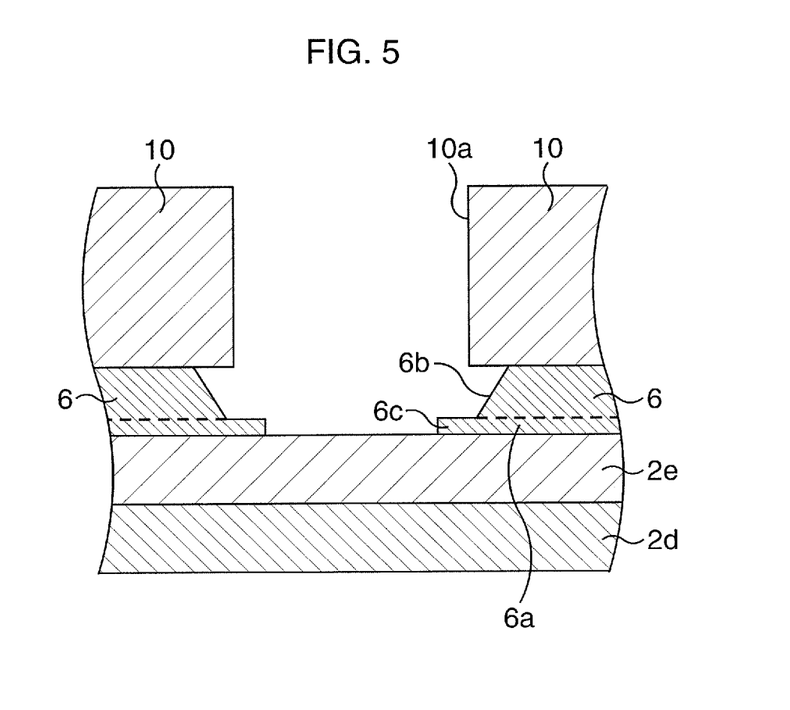
FIG. 5 is a schematic sectional view illustrating, on an enlarged scale, a part of an opening in the passivation film formed in the step in FIG. 2B.

FIG. 5 illustrates, on an enlarged scale, the opening 6b of the passivation film 6.

The passivation film 6 is isotropically etched by the wet etching, and the opening 6b is formed so as to have a forward tapered side surface. Since the etching rate at the lower layer portion 6a is lower than that at the other portion at the opening 6b, a projecting portion 6c projecting from the side surface of the opening 6b is formed at the lower layer portion 6a. The projecting portion 6c is formed according to the etching rates so as to have a width of, e.g., about 10 nm. Since the projecting portion 6c is a part of the lower layer portion 6a and has a high percentage of N vacancies, silicon nitride at the projecting portion 6c is oxidized to form silicon oxynitride.

The resist mask 10 is removed by ashing using oxygen plasma or wet treatment using a drug solution.

Figure 2C:
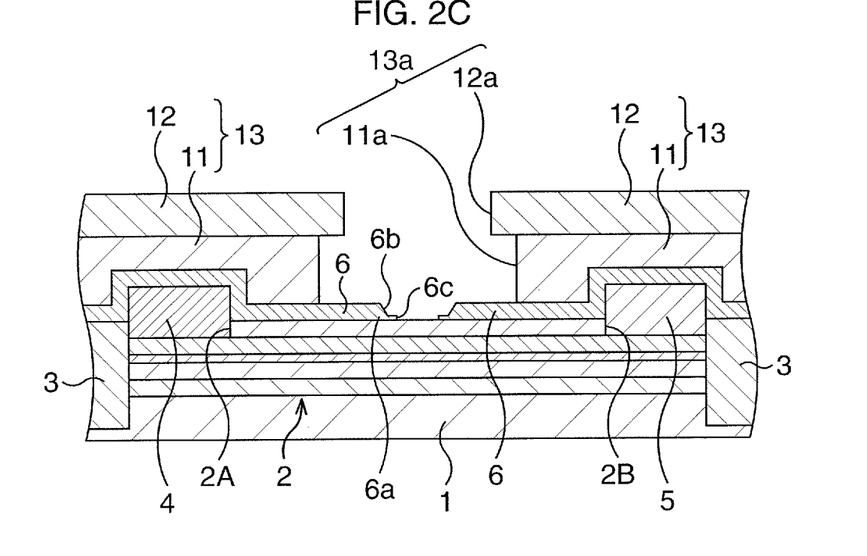

As illustrated in FIG. 2C, a resist mask 13 for gate formation is formed.

More specifically, a lower layer resist 11 (e.g., the product named PMGI, manufactured by MicroChem Corp., USA) and an upper layer resist 12 (e.g., the product named SUMIRESIST PFI32-A8, manufactured by Sumitomo Chemical Co., Ltd.) are applied to the entire surface by, e.g., spin coating. An opening 12a, e.g., about 1.5 μm long is formed in the upper layer resist 12 by UV exposure. The lower layer resist 11 is wet-etched with an alkaline developer by using the upper layer resist 12 as a mask to form an opening 11a in the lower layer resist 11. With the above-described processes, the resist mask 13 including the lower layer resist 11 having the opening 11a and the upper layer resist 12 having the opening 12a is formed. In the resist mask 13, an opening constituted by the openings 11a and 12a communicating with each other is denoted by reference characters 13a.

Figure 3A:
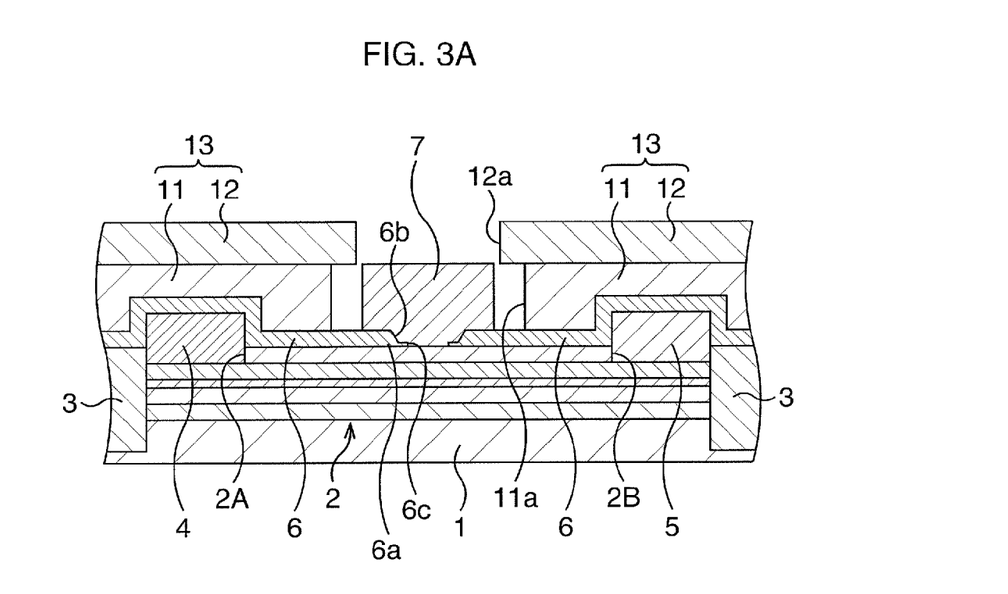
FIGS. 3A and 3B are schematic sectional views illustrating, in the order of steps, the method for manufacturing the Schottky AlGaN/GaN HEMT according to the first embodiment, following FIGS. 2A to 2C.

As illustrated in FIG. 3A, a gate electrode 7 is formed.

More specifically, a gate metal (Ni with a thickness of about 10 nm and Au with a thickness of about 300 nm) is vapor-deposited across the surface of the resist mask 13 and in the opening 13a by using the resist mask 13 as a mask. With this process, the gate electrode 7 is formed so as to plug the opening 6b of the passivation film 6 with the gate metal and form a Schottky contact with the surface of the compound semiconductor layer 2.

Figure 3B:
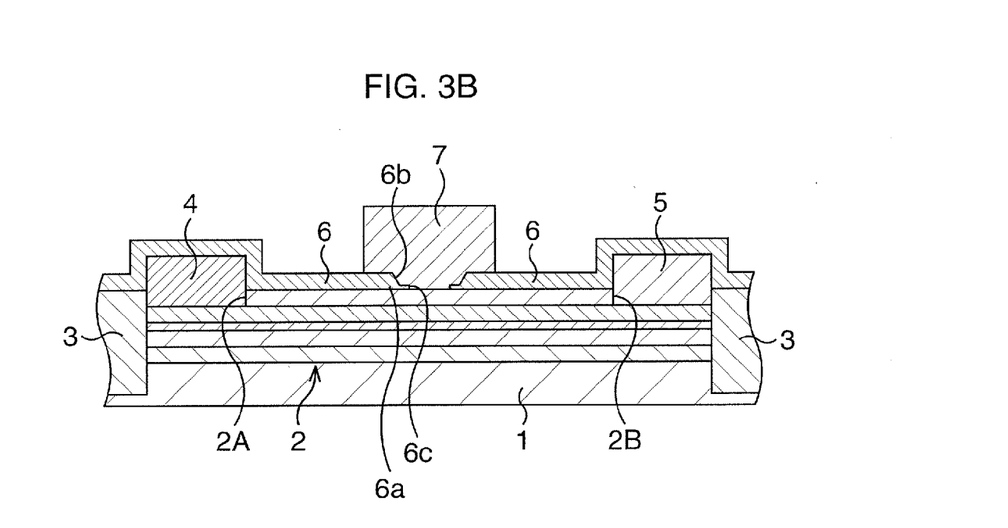

As illustrated in FIG. 3B, the resist mask 13 is removed.

More specifically, the SiC substrate 1 is soaked in N-methylpyrrolidinone heated to 80° C., and the resist mask 13 and unnecessary portions of the gate metal are removed by lift-off. A lower portion of the gate electrode 7 forms a Schottky contact with the surface of the compound semiconductor layer 2 in the opening 6b, and an upper portion is formed so as to be wider than the opening 6b and has an overhanging shape.

After steps such as electrical connection of the source electrode 4 and drain electrode 5 and the gate electrode 7, a Schottky AlGaN/GaN HEMT is formed.

Effects of the Schottky AlGaN/GaN HEMT according to the present embodiment will be described below.

A conventional passivation film is of uniform elemental composition from an interface with a compound semiconductor layer to an upper surface of the passivation film. An opening in the passivation film where a gate electrode is to be formed has a side surface of monotonous shape and is of homogenous elemental composition.

In the AlGaN/GaN HEMT according to the present embodiment, the passivation film 6 including the lower layer portion 6a made of silicon nitride with many N vacancies (the percentage of which to N atoms of silicon nitride in stoichiometric condition is not less than 50%) and having a very small thickness (not more than 5 nm) is formed so as to be in contact with the surface of the compound semiconductor layer 2. In the passivation film 6, the percentage of N vacancies of the lower layer portion 6a is higher than that of silicon nitride in stoichiometric condition ($Si_3N_4$). The passivation film 6 is formed so as to drastically and continuously approach stoichiometric condition toward the top. The lower layer portion 6a that is a silicon nitride film with many N vacancies, i.e., a silicon nitride film with many positive charges lowers the energy of the conduction band at the surface of the compound semiconductor layer 2 to reduce access resistance. The efficacy in lowering the energy of the conduction band blocks the influence of an electron trap at the surface of the compound semiconductor layer 2 to reduce current collapse.

In the opening 6b of the passivation film 6 where the gate electrode 7 as a Schottky electrode is formed, a part of the lower layer portion 6a is formed as the projecting portion 6c projecting from the side surface of the opening 6b toward a Schottky interface, due to the low etching rate at the lower layer portion 6a having many N vacancies and the very small thickness. Since the projecting portion 6c has many N vacancies and is chemically active, the projecting portion 6c is highly susceptible to oxidation. The projecting portion 6c is likely to turn into a silicon oxynitride film and exhibits high insulation performance. The presence of the projecting portion 6c reduces electric field concentration on an edge of the gate electrode 7, inhibits the gate electrode 7 from being broken down due to a high electric field, and contributes to enhancement of the reliability of the device.

Figure 6A:
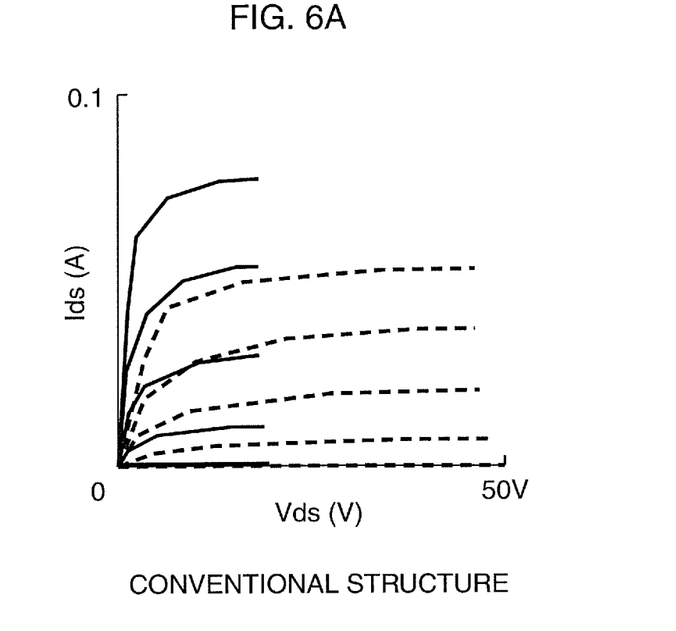
FIGS. 6A and 6B are graphs illustrating results of checking characteristics of three terminals of the AlGaN/GaN HEMT according to the first embodiment on the basis of comparison with an AlGaN/GaN HEMT with the above-described conventional structure including the conventional passivation film.
Figure 6B:
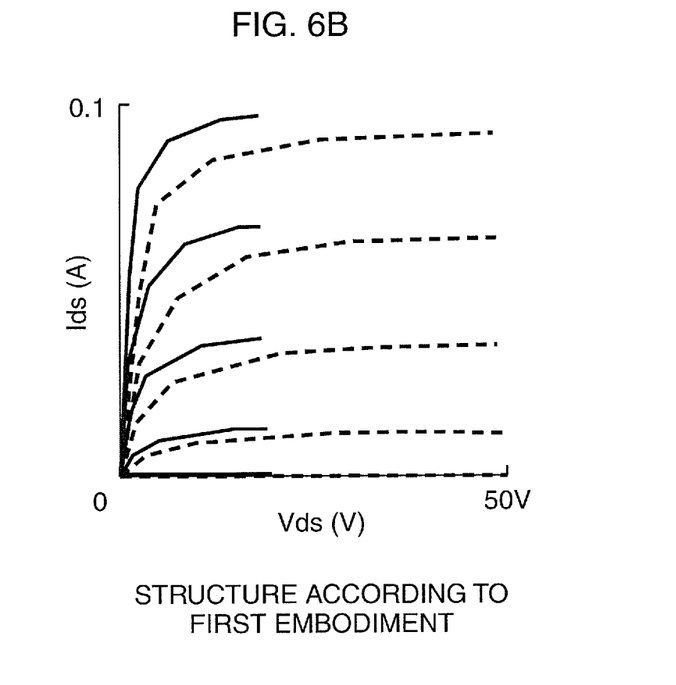

Characteristics of three terminals of an AlGaN/GaN HEMT according to the present embodiment were checked on the basis of comparison with the AlGaN/GaN HEMT with the above-described conventional structure including the conventional passivation film. FIGS. 6A and 6B illustrate results of the checking. FIG. 6A illustrates the result of the conventional structure while FIG. 6B illustrates the result of the present embodiment.

As can be seen from FIGS. 6A and 6B, the present embodiment was confirmed to have achieved significant improvement in terms of current collapse over the conventional structure. The present embodiment was also confirmed to have little change in gate current at a high-temperature current test and not to have a breakdown.

As has been described above, according to the present embodiment, a highly reliable Schottky AlGaN/GaN HEMT which achieves high voltage and high power by reducing electric field concentration on an electrode edge to ensure inhibition of deterioration in device characteristics as well as increasing operating voltage is achieved.

Second Embodiment

A Schottky AlGaN/GaN HEMT according to the second embodiment will be described below. The present embodiment is different from the first embodiment in the configuration of a passivation film. The same components and the like as those of an AlGaN/GaN HEMT according to the first embodiment are denoted by the same reference numerals, and a detailed description thereof will be omitted.

Figure 7A:
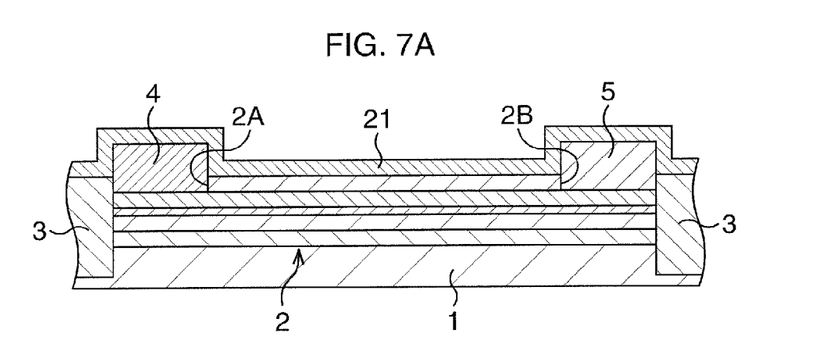
FIGS. 7A to 7C are schematic sectional views illustrating main steps of a method for manufacturing a Schottky AlGaN/GaN HEMT according to a second embodiment.
Figure 7B:
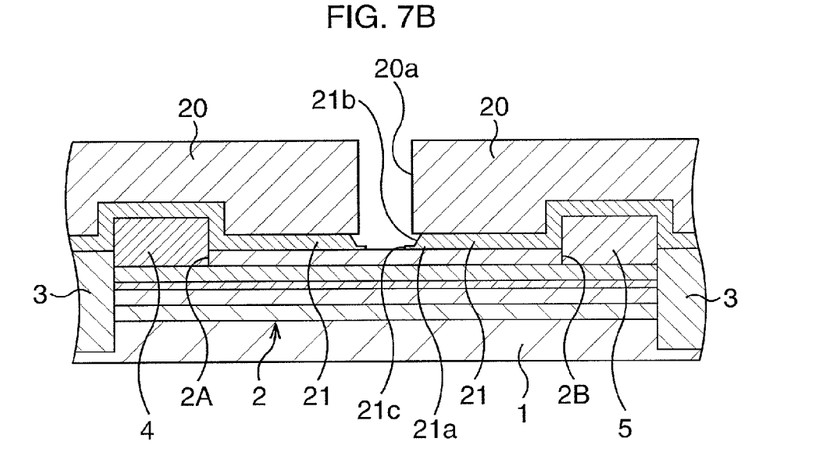
Figure 7C:
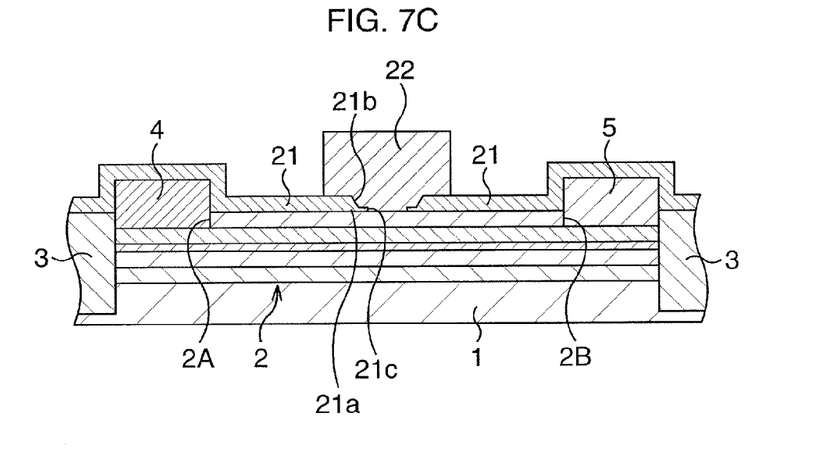

FIGS. 7A to 7C are schematic sectional views illustrating main steps of a method for manufacturing the Schottky AlGaN/GaN HEMT according to the second embodiment.

The steps in FIGS. 1A to 1C according to the first embodiment are first performed to form a source electrode 4 and a drain electrode 5 on a compound semiconductor layer 2.

As illustrated in FIG. 7A, a passivation film 21 for protecting a surface of the compound semiconductor layer 2 is formed.

More specifically, silicon nitride (a silicon nitride) is deposited across the surface of the compound semiconductor layer 2 to a thickness of, e.g., about 50 nm by plasma CVD or the like to form the passivation film 21. A silicon nitride is a stable insulator and is suitably used for a protective film of the surface of the compound semiconductor layer 2.

Figure 8:
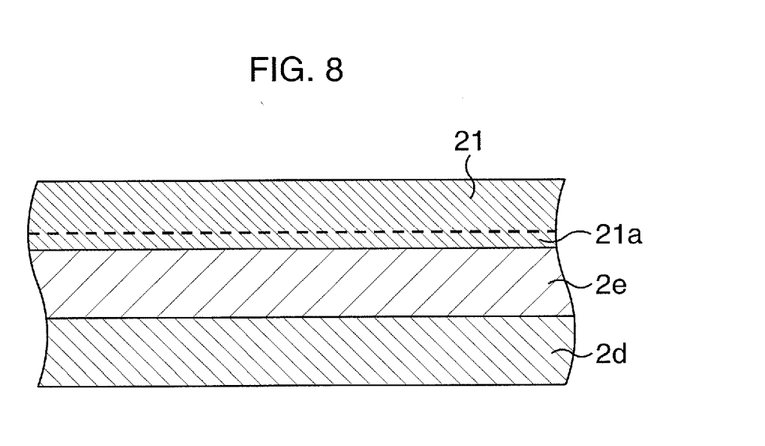
FIG. 8 is a schematic sectional view illustrating, on an enlarged scale, a part of a passivation film formed in the step in FIG. 7A.

FIG. 8 illustrates, on an enlarged scale, a part of the passivation film 21.

In the passivation film 21, a lower layer portion 21a in contact with the surface of the compound semiconductor layer 2 is made of polysilicon. The passivation film 21 is formed so as to drastically and continuously approach stoichiometric condition ($Si_3N_4$) toward the top. Note that although a boundary between the lower layer portion 21a and the other portion is illustrated by a broken line for the sake of convenience, there may be no clear boundary. The thickness of the lower layer portion 21a is about 2 to 5 nm. If the thickness of the lower layer portion 21a is less than 2 nm, the lower layer portion cannot provide sufficient efficacy (to be described later). If the thickness of the lower layer portion 21a is more than 5 nm, a gate leak current is larger. Since the thickness of the lower layer portion 21a is set to about 2 to 5 nm, the lower layer portion can provide sufficient efficacy (to be described later) without increasing a gate leak current. In the present embodiment, the lower layer portion 21a is formed so as to have a thickness of, e.g., about 3 nm.

To form the passivation film 21, for example, $SiH_4$ gas is supplied into a film forming chamber for plasma CVD at a flow rate of 5 sccm before electric discharge. RF waves (13.56 MHz, 50 W) are applied through a shower head, e.g., 30 sec after the start of the introduction of $SiH_4$ gas. $N_2$ gas starts to be supplied at a flow rate of 200 sccm within 2 sec of the start of the introduction of $SiH_4$ gas.

As illustrated in FIG. 7B, an opening 21b is formed in the passivation film 21.

More specifically, a resist is first applied to the entire surface of the passivation film 21. The resist is subjected to exposure for an opening having a width of, e.g., 600 nm by the UV method and is developed. With these processes, a resist mask 20 having an opening 20a is formed.

The passivation film 21 is wet-etched by using the resist mask 20. The wet etching is performed under the condition that the etching rate at the lower layer portion 21a of the passivation film 21 is lower than that at the other portion. A buffer solution which is a mixture of hydrofluoric acid and ammonium fluoride is used as an etchant. With the wet etching, a portion exposed in the opening 20a of the passivation film 21 is etched, and the opening 21b is formed in the passivation film 21.

Figure 9:
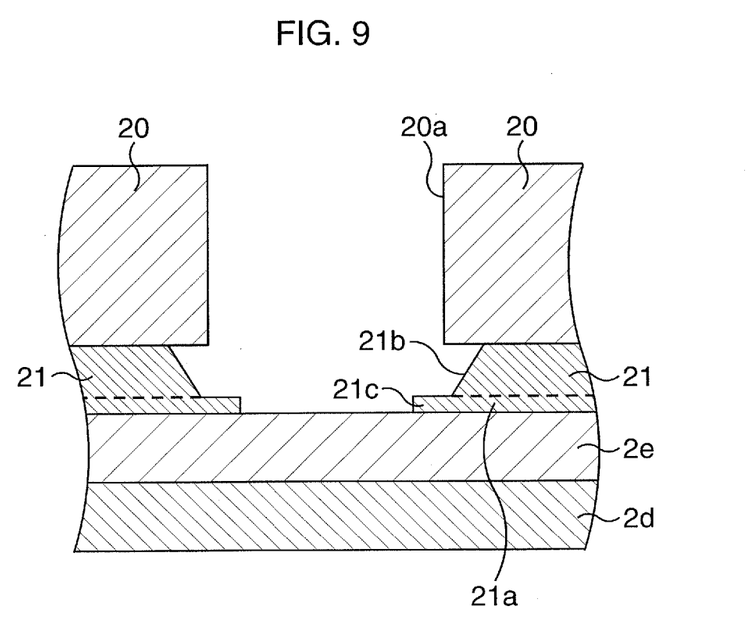
FIG. 9 is a schematic sectional view illustrating, on an enlarged scale, a part of an opening in the passivation film formed in the step in FIG. 7B.

FIG. 9 illustrates, on an enlarged scale, the opening 21b of the passivation film 21.

The passivation film 21 is isotropically etched by the wet etching, and the opening 21b is formed so as to have a forward tapered side surface. Since the etching rate at the lower layer portion 21a is lower than that at the other portion at the opening 21b, a projecting portion 21c projecting from the side surface of the opening 21b is formed at the lower layer portion 21a. The projecting portion 21c is formed according to the etching rates so as to have a width of, e.g., about 10 nm. Since the projecting portion 21c is a part of the lower layer portion 21a and is made of polysilicon likely to be oxidized, polysilicon at the projecting portion 21c is oxidized to form silicon oxide.

The resist mask 20 is removed by ashing using oxygen plasma or wet treatment using a drug solution.

The steps in FIGS. 2C to 3B according to the first embodiment are performed to obtain a structure in FIG. 7C.

After steps such as electrical connection of the source electrode 4 and drain electrode 5 and the gate electrode 7, a Schottky AlGaN/GaN HEMT is formed.

Effects of the Schottky AlGaN/GaN HEMT according to the present embodiment will be described below.

In the AlGaN/GaN HEMT according to the present embodiment, the passivation film 21 including the lower layer portion 21a made of polysilicon and having a very small thickness (not more than 5 nm) is formed so as to be in contact with the surface of the compound semiconductor layer 2. The passivation film 21 is formed so as to drastically and continuously approach stoichiometric condition from the lower layer portion 21a made of polysilicon toward the top. The lower layer portion 21a made of polysilicon lowers the energy of the conduction band at the surface of the compound semiconductor layer 2 to reduce access resistance. The efficacy in lowering the energy of the conduction band blocks the influence of an electron trap at the surface of the compound semiconductor layer 2 to reduce current collapse.

In the opening 21b of the passivation film 21 where the gate electrode 7 as a Schottky electrode is formed, a part of the lower layer portion 21a is formed as the projecting portion 21c projecting from the side surface of the opening 21b toward a Schottky interface, due to the low etching rate at the lower layer portion 21a made of polysilicon and having the very small thickness. Since the projecting portion 21c is made of polysilicon and is highly susceptible to oxidation, the projecting portion 21c is likely to turn into a silicon oxynitride film and exhibits high insulation performance. The presence of the projecting portion 21c reduces electric field concentration on an edge of the gate electrode 7, inhibits the gate electrode 7 from being broken down due to a high electric field, and contributes to enhancement of the reliability of the device.

Figure 10A:
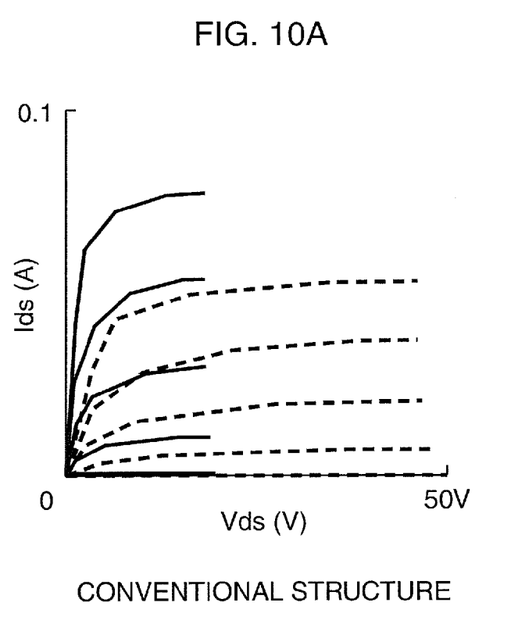
FIGS. 10A and 10B are graphs illustrating results of checking characteristics of three terminals of the AlGaN/GaN HEMT according to the second embodiment on the basis of comparison with the AlGaN/GaN HEMT with the above-described conventional structure including the conventional passivation film.
Figure 10B:
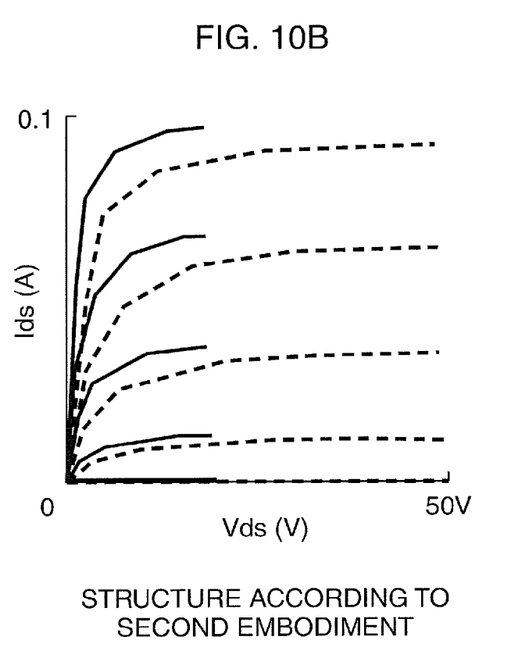

Characteristics of three terminals of an AlGaN/GaN HEMT according to the present embodiment were checked on the basis of comparison with the AlGaN/GaN HEMT with the above-described conventional structure including the conventional passivation film. FIGS. 10A and 10B illustrate results of the checking. FIG. 10A illustrates the result of the conventional structure while FIG. 10B illustrates the result of the present embodiment.

As can be seen from FIGS. 10A and 10B, the present embodiment was confirmed to have achieved significant improvement in terms of current collapse over the conventional structure. The present embodiment was also confirmed to have little change in gate current at a high-temperature current test and not to have a breakdown.

As has been described above, according to the present embodiment, a highly reliable Schottky AlGaN/GaN HEMT which achieves high voltage and high power by reducing electric field concentration on an electrode edge to ensure inhibition of deterioration in device characteristics as well as increasing operating voltage is achieved.

Third Embodiment

The present embodiment discloses a power supply unit including an AlGaN/GaN HEMT according to the first embodiment or the second embodiment.

Figure 11:
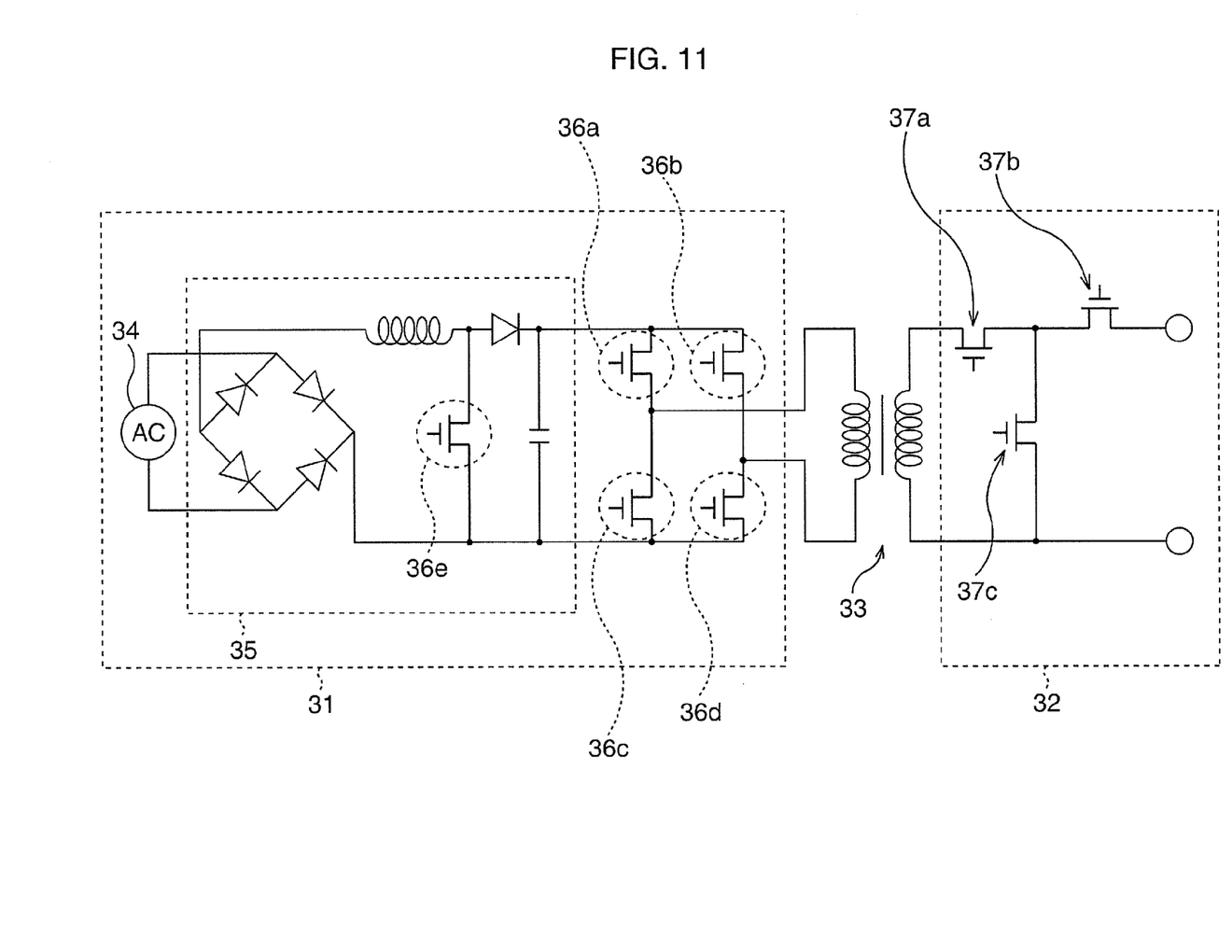
FIG. 11 is a connection diagram illustrating the schematic configuration of a power supply unit according to a third embodiment.

FIG. 11 is a connection diagram illustrating the schematic configuration of the power supply unit according to the third embodiment.

The power supply unit according to the present embodiment includes a high-voltage primary circuit 31, a low-voltage secondary circuit 32, and a transformer 33 which is disposed between the primary circuit 31 and the secondary circuit 32.

The primary circuit 31 includes an alternating-current power supply 34, a so-called bridge rectifier circuit 35, and a plurality of (four in the present embodiment) switching devices 36a, 36b, 36c, and 36d. The bridge rectifier circuit 35 includes a switching device 36e.

The secondary circuit 32 includes a plurality of (three in the present embodiment) switching devices 37a, 37b, and 37c.

In the present embodiment, an AlGaN/GaN HEMT according to the first embodiment or the second embodiment is used as each of the switching devices 36a, 36b, 36c, 36d, and 36e of the primary circuit 31. In contrast, a normal MIS-FET using silicon is used as each of the switching devices 37a, 37b, and 37c of the secondary circuit 32.

In the present embodiment, a highly reliable Schottky AlGaN/GaN HEMT which achieves high voltage and high power by reducing electric field concentration on an electrode edge to ensure inhibition of deterioration in device characteristics as well as increasing operating voltage is applied to a high-voltage circuit. This configuration achieves a highly reliable, high-power power supply circuit.

Fourth Embodiment

The present embodiment discloses a high-frequency amplifier to which an AlGaN/GaN HEMT according to the first embodiment or the second embodiment is applied.

Figure 12:
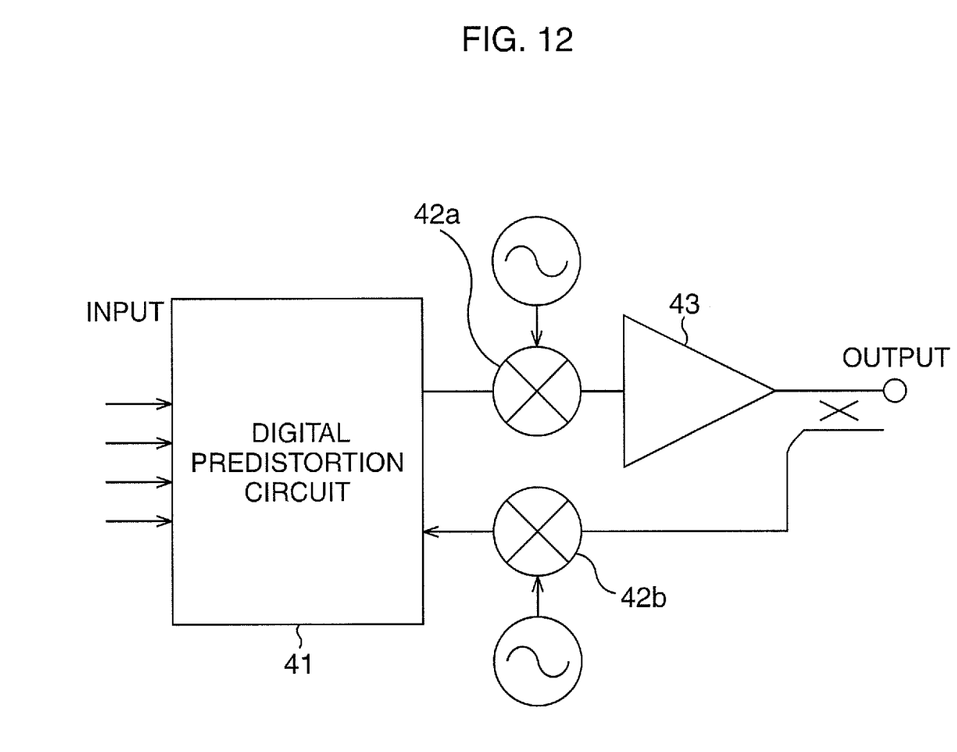
FIG. 12 is a connection diagram illustrating the schematic configuration of a high-frequency amplifier according to a fourth embodiment.

FIG. 12 is a connection diagram illustrating the schematic configuration of the high-frequency amplifier according to the fourth embodiment.

The high-frequency amplifier according to the present embodiment includes a digital predistortion circuit 41, mixers 42a and 42b, and a power amplifier 43.

The digital predistortion circuit 41 is intended to compensate for nonlinear distortion of an input signal. The mixer 42a is intended to mix the input signal whose nonlinear distortion has been compensated for and an AC signal. The power amplifier 43 is intended to amplify the input signal mixed with the AC signal and includes an AlGaN/GaN HEMT according to the first embodiment or the second embodiment. Note that the high-frequency amplifier in FIG. 12 is configured so as to be capable of mixing a signal on the output side with an AC signal in the mixer 42b and sending out the mixed signal to the digital predistortion circuit 41 by, e.g., flipping a switch.

In the present embodiment, a highly reliable Schottky AlGaN/GaN HEMT which achieves high voltage and high power by reducing electric field concentration on an electrode edge to ensure inhibition of deterioration in device characteristics as well as increasing operating voltage is applied to a high-frequency amplifier. This configuration achieves a highly reliable, high-voltage high-frequency amplifier.

Other Embodiments

The first to fourth embodiments illustrate an AlGaN/GaN HEMT as a compound semiconductor device. The embodiments can be applied to the HEMTs below as a compound semiconductor device, in addition to an AlGaN/GaN HEMT.

Another HEMT

Example 1

The present example discloses an InAlN/GaN HEMT as a compound semiconductor device.

InAlN and GaN are compound semiconductors whose lattice constants can be made closer to each other by changing the composition. In the first to fourth embodiments described above, an electron transit layer is formed from i-GaN, an intermediate layer is formed from AlN, an electron supply layer is formed from n-InAlN, and a cap layer is formed from n-GaN. Since piezoelectric polarization hardly occurs in this case, two-dimensional electron gas is generated mainly due to spontaneous polarization of InAlN.

According to the present example, a highly reliable Schottky InAlN/GaN HEMT which achieves high voltage and high power by reducing electric field concentration on an electrode edge to ensure inhibition of deterioration in device characteristics as well as increasing operating voltage is achieved, like the above-described AlGaN/GaN HEMTs.

Another HEMT

Example 2

The present example discloses an InAlGaN/GaN HEMT as a compound semiconductor device.

GaN and InAlGaN are compound semiconductors, and the lattice constant of the latter can be made lower than that of the former by changing the composition. In the first to fourth embodiments, an electron transit layer is formed from i-GaN, an intermediate layer is formed from i-InAlGaN, an electron supply layer is formed from n-InAlGaN, and a cap layer is formed from n-GaN.

According to the present example, a highly reliable Schottky InAlN/GaN HEMT which achieves high voltage and high power by reducing electric field concentration on an electrode edge to ensure inhibition of deterioration in device characteristics as well as increasing operating voltage, like the above-described AlGaN/GaN HEMTs.

According to the above-described embodiments, a highly reliable compound semiconductor device which achieves high voltage and high power by reducing electric field concentration on an electrode edge to ensure inhibition of deterioration in device characteristics as well as increasing operating voltage is achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for manufacturing a compound semiconductor device, the method comprising:
   forming a silicon nitride protective film on a compound semiconductor layer;
   forming an opening in the protective film; and
   forming an electrode on the compound semiconductor layer so as to plug the opening,
   wherein the forming the opening comprises forming the opening such that a lower layer portion of the protective film includes a projecting portion projecting from a side surface of the opening, and
   wherein the protective film is formed such that the percentage of nitrogen vacancies of the lower layer portion is higher than the percentage of nitrogen vacancies of silicon nitride in stoichiometric condition and such that the protective film continuously approaches stoichiometric condition toward a top.

2. The method for manufacturing the compound semiconductor device according to claim 1, wherein the percentage of nitrogen vacancies of the lower layer portion in the protective film to N atoms of silicon nitride in stoichiometric condition is not more than 50%.

3. The method for manufacturing the compound semiconductor device according to claim 1, wherein the protective film is formed such that the lower layer portion is made of polysilicon and such that the protective film approaches stoichiometric condition toward a top.

4. The method for manufacturing the compound semiconductor device according to claim 1, wherein the forming the opening comprises wet-etching the protective film under the condition that an etching rate of the lower layer portion is lower than an etching rate of another portion and forming the projecting portion together with the opening.

5. The method for manufacturing the compound semiconductor device according to claim 1, wherein the projecting portion in the protective film is oxidized.

6. The method for manufacturing the compound semiconductor device according to claim 1, wherein thickness of the lower layer portion in the protective film has a value within the range of 2 to 5 nm.

* * * * *